(12) United States Patent
McNulty et al.

(10) Patent No.: US 11,320,458 B2
(45) Date of Patent: May 3, 2022

(54) HIGH VOLTAGE TEST TERMINAL WITH GUARD ELECTRODE AND GUARD INSULATION LAYER

(71) Applicant: Hubbell Incorporated, Shelton, CT (US)

(72) Inventors: Andrew Victor McNulty, Spencerport, NY (US); Daniel Eric Huenger, West Henrietta, NY (US); Eric Ralph Weatherbee, Attica, NY (US); Adam Robert Fronk, Delevan, NY (US); Shibao Zhang, Pittsford, NY (US)

(73) Assignee: Hubbell Incorporated, Shelton, CT (US)

( * ) Notice: Subject to any disclaimer, the term of this patent is extended or adjusted under 35 U.S.C. 154(b) by 111 days.

(21) Appl. No.: 16/554,755

(22) Filed: Aug. 29, 2019

(65) Prior Publication Data

US 2020/0072868 A1    Mar. 5, 2020

Related U.S. Application Data

(60) Provisional application No. 62/725,321, filed on Aug. 31, 2018.

(51) Int. Cl.
*H01B 17/00* (2006.01)
*H01H 31/12* (2006.01)
*H01R 39/00* (2006.01)
*G01R 31/327* (2006.01)
*G01R 1/04* (2006.01)

(52) U.S. Cl.
CPC ....... *G01R 1/0408* (2013.01); *G01R 31/3274* (2013.01)

(58) Field of Classification Search
CPC .... H01B 17/00; H01B 17/002; H01B 17/265; H01B 17/301; H01B 17/42; H01H 31/12; H01R 39/00; G01R 31/02; G01R 31/327; G01R 1/04
See application file for complete search history.

(56) References Cited

U.S. PATENT DOCUMENTS

| | | | |
|---|---|---|---|
| 3,363,172 A | 1/1968 | Doble | |
| 8,525,526 B2 * | 9/2013 | Ko | G01R 31/3274 324/552 |
| 2016/0268022 A1 * | 9/2016 | Kumar | H01B 17/005 |

* cited by examiner

*Primary Examiner* — Neel D Shah
(74) *Attorney, Agent, or Firm* — Michael Best & Friedrich LLP

(57) ABSTRACT

A high-voltage test terminal includes a first conductor, a second conductor, and a primary insulator disposed between and coupled to the first and second conductors. A blade is movably connected to the second conductor. The blade is electrically and mechanically connected to the first conductor in a first position and electrically isolated and mechanically disconnected from the first conductor in a second position. A guard insulation layer is disposed between the primary insulator and the first conductor.

20 Claims, 8 Drawing Sheets

HIGH VOLTAGE TEST TERMINAL WITH GUARD ELECTRODE AND GUARD INSULATION LAYER

CROSS-REFERENCE TO RELATED APPLICATION

This application is based on U.S. Provisional Application Ser. No. 62/725,321, filed Aug. 31, 2018, the disclosure of which is incorporated herein by reference in their entirety and to which priority is claimed.

FIELD

Various exemplary embodiments relate to a high voltage test terminal for an electrical power distribution/transmission system.

BACKGROUND

Test terminals are used to perform field tests of electrical apparatus. For example, test terminals are used to conduct dielectric tests of substation equipment, such as transformers, circuit breakers, and bushings. Properly testing electrical apparatus extends the service life of the electrical apparatus and facilitates preventing apparatus failure, which results in expensive downtime, lost revenue and costly apparatus repair and replacement.

The test terminal is disposed in an electrical distribution/transmission system between a high voltage power bus and the electrical apparatus to be tested. The test terminal eliminates the need to physically remove the power bus during testing. In the closed position, the test terminal allows electrical power to be transferred between the power bus and the electrical apparatus. When the test terminal is in an open position, the electrical apparatus is electrically isolated from the power bus such that electrical tests of the electrical apparatus can be conducted.

SUMMARY

According to an exemplary embodiment, a high-voltage test terminal includes a first conductor, a second conductor, and a primary insulator disposed between and coupled to the first and second conductors. A blade is movably connected to the second conductor. The blade is electrically and mechanically connected to the first conductor in a first position and electrically isolated and mechanically disconnected from the first conductor in a second position. A guard insulation layer is disposed between the primary insulator and the first conductor.

According to another exemplary embodiment, a high-voltage test terminal includes a first conductor, a second conductor, and a primary insulator disposed between and coupled to the first and second conductors. A blade is movably connected to the second conductor. The blade is electrically and mechanically connected to the first conductor in a first position and electrically isolated and mechanically disconnected from the first conductor in a second position. A guard conductor and guard insulation layer are disposed between the primary insulator and the first conductor. The guard conductor is disposed between the primary insulator and guard insulation layer. The guard insulation layer is disposed between the guard conductor and the first conductor. A guard electrode extends between the guard conductor and the blade.

Another exemplary embodiment is directed to a method of field testing electrical apparatus. A test terminal having an insulator is connected between a high voltage bus and the electrical apparatus to be tested, wherein the test terminal includes a blade in a closed position for normal operation. The blade of the test terminal is moved to an open position to electrically isolate the electrical apparatus from the deenergized high voltage bus. Electrical and mechanical tests of the electrical apparatus are conducted after moving the blade to the open position, the insulator protecting the test terminal from shocks and vibrations resulting from the electrical and mechanical tests.

BRIEF DESCRIPTION OF THE DRAWINGS

The aspects and features of various exemplary embodiments will be more apparent from the description of those exemplary embodiments taken with reference to the accompanying drawings.

DETAILED DESCRIPTION OF EXEMPLARY EMBODIMENTS

Figure 1:
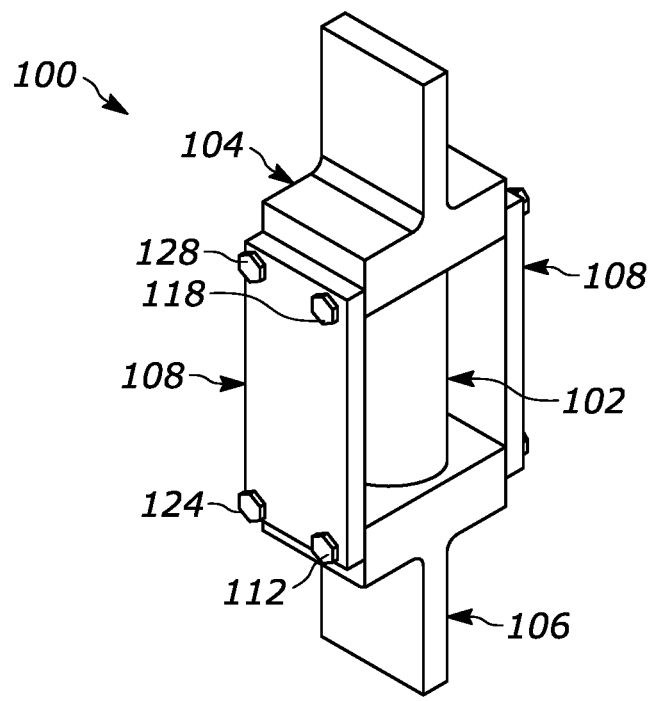
FIG. 1 is a perspective view of a first exemplary high voltage test terminal in a closed position.
Figure 2:
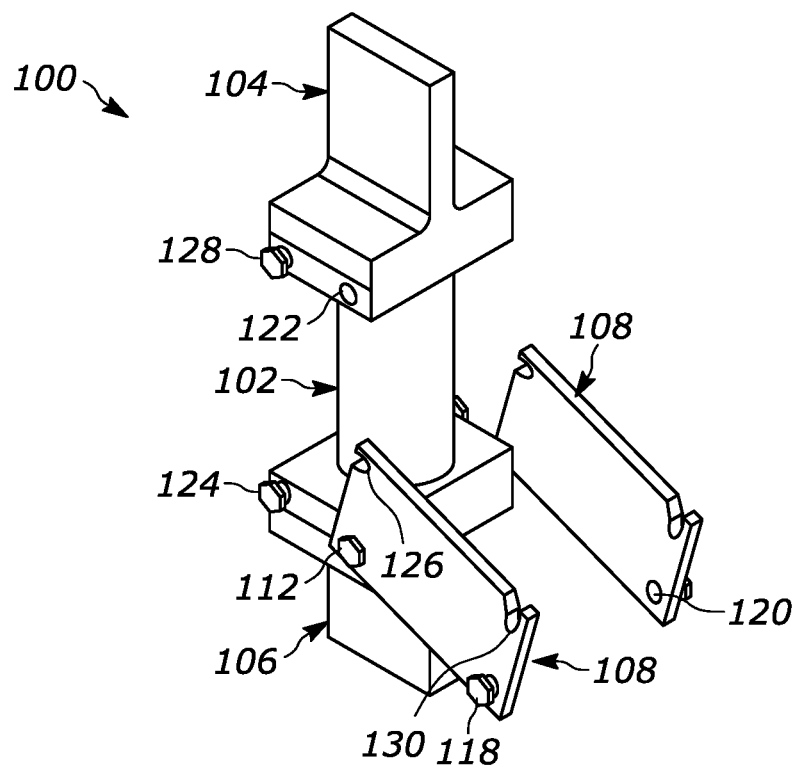
FIG. 2 is a perspective view of the high voltage test terminal of FIG. 1 in an open position.

As shown in FIGS. 1 and 2, a high voltage test terminal 100 for an electrical power distribution/transmission system includes a primary shock-absorbing insulator 102 disposed between a first conductor 104 and a second conductor 106. One or more side conductors (hereinafter "blades") 108 are movably connected to each side of the second conductor 106. Different styles of side conductors can be used, including cables, bars, wires, etc. The blades 108 are electrically and mechanically connected to the first conductor 104 in a first position (i.e. closed), as shown in FIG. 1, and electrically isolated and mechanically disconnected from the first conductor 104 in a second position (i.e. open), as shown in FIG. 2. The blades 108 are positioned in the first position for normal operation of an electrical apparatus (e.g. transformer, circuit breaker, bushing, etc.). The blades 108 are moved to the second position to conduct both electrical and mechanical tests of the electrical apparatus.

Each of the blades 108 has a first fastener 112 that movably and pivotally connects the first blade to the second conductor 106. The first fastener 112 can be received by a thru hole in the blade 108 and a threaded hole in the second conductor 106. A second fastener 118 secures the blade 108 to the first conductor 104. A first fastener hole 120 in the blade 108 threadably receives the second fastener 118 and a second fastener hole 122 in the first conductor receives the second fastener 118. A third fastener 124 connected to the second conductor 106 receives a first notch 126 in the blade 108. A fourth fastener 128 connected to the first conductor 104 receives a second notch 130 in the blade 108. Washers can be disposed between each of the fasteners and the blade 108. The blades 108 can be movably connected to the first and second conductors 104, 106 in any other suitable manner. The first and second conductors 104, 106 and the first and second blades 108 can be made of any conductive material, for example aluminum or copper.

The primary insulator 102 has a first end connected to the first conductor 104 and a second end connected to the second conductor 106. The primary insulator can be made of a shock absorbing material (e.g. fiberglass or epoxy-wound filament rods or tubes) to protect the test terminal from shocks and vibrations associated with mechanical field testing of the electrical apparatus. The ends of the primary shock absorbing insulator 102 can be connected to the first and second conductors 104, 106 in any suitable manner, including crimping, secured with an adhesive (e.g. potting compound), threaded connection, and interference fit.

Figure 3:
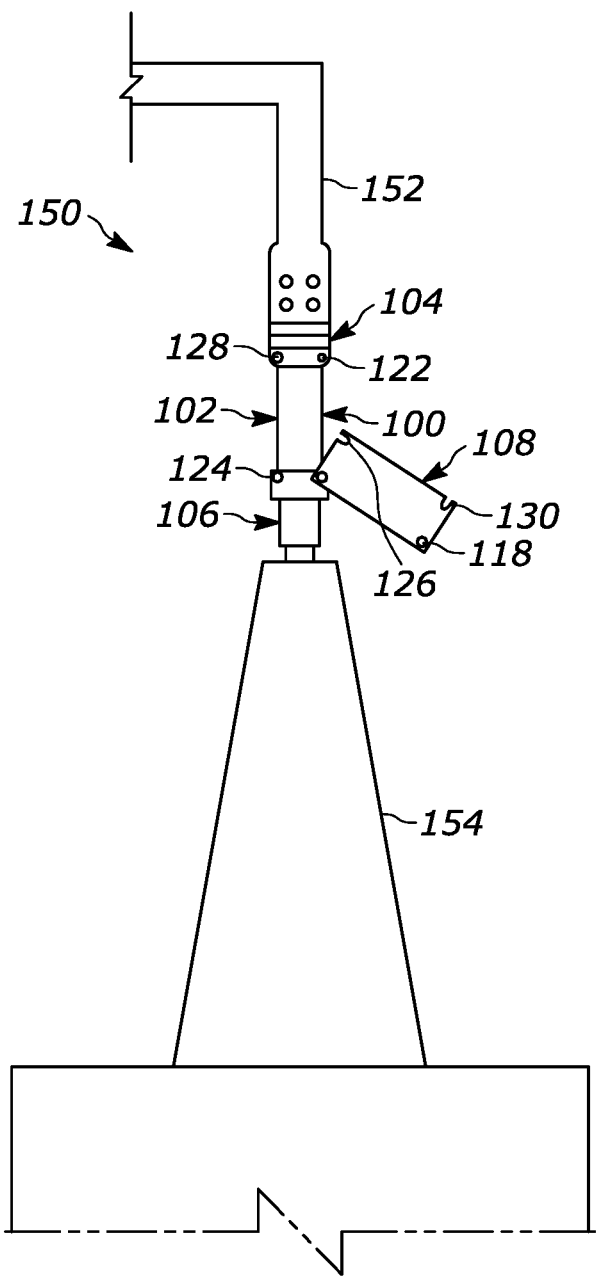
FIG. 3 is a side elevational view of the high voltage test terminal of FIG. 2. electrically connected in a power distribution/transmission system.

The test terminal 100 is disposed in the power distribution/transmission system 150 between a high-voltage power bus 152 and an electrical apparatus to be field tested (e.g. bushing), as shown in FIG. 3. With the blades 108 in the closed position electrical power is transferred between the power bus 152 and the electrical apparatus 154 through the test terminal 100. After the power bus 152 is deenergized and grounded in preparation for the field test, the blade 108 is moved to the open position, the testing voltage is prevented from passing through the test terminal 100 to the deenergized power bus 152, thereby electrically isolating the electrical apparatus for field testing.

When the field testing is complete, the blades 108 are returned to the closed position, such that the third and fourth fasteners 124, 128 receive the notches 126, 130, respectively. The second fastener 118 is reinserted in the fastener hole 122 in the first conductor 104. The first, second, third and fourth fasteners 112, 118, 124, 128 are then tightened to secure the blades 108 to the first conductor 104 and second conductor 106. The blades 108 are then electrically and mechanically connected between the first and second conductors 104 and 106, such that electrical power is transferred between the power bus 152 and the electrical apparatus through the test terminal 100.

Figure 4:
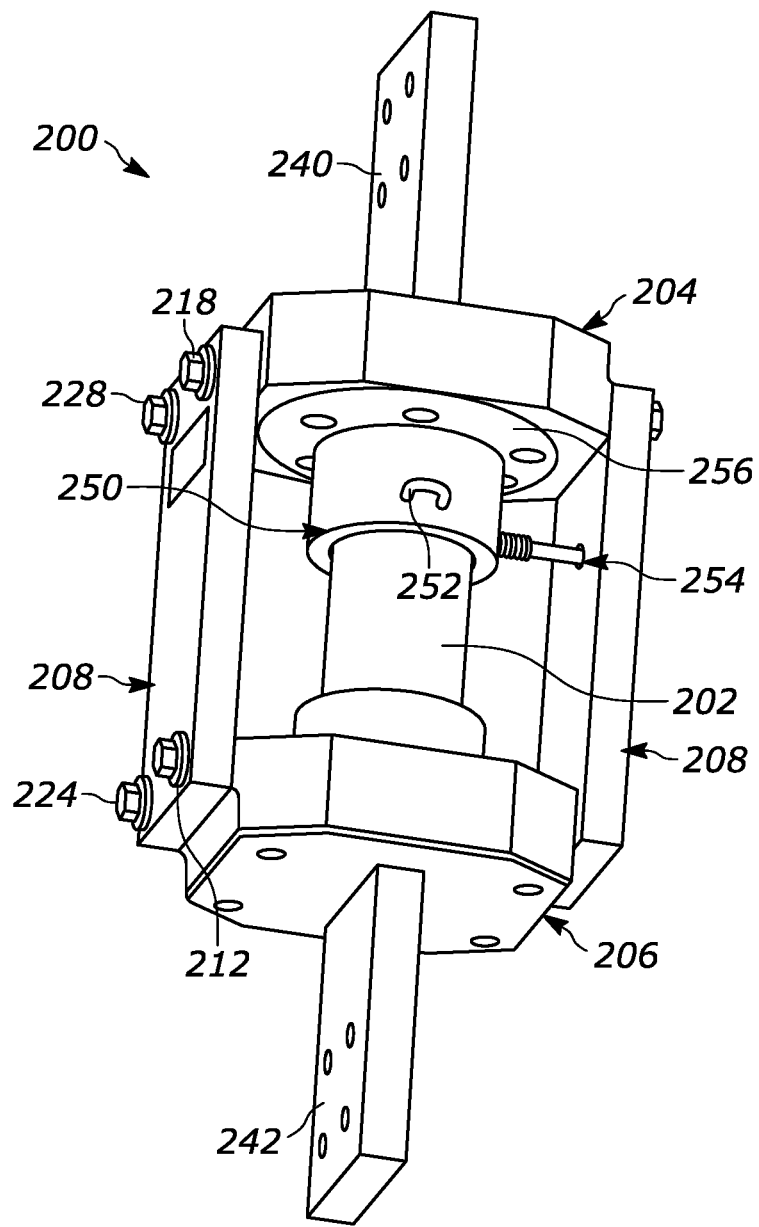
FIG. 4 is a perspective view of a second exemplary high voltage test terminal in a closed position.

FIG. 4 shows an exemplary embodiment of another high voltage test terminal 200. The high voltage test terminal 200 includes a primary insulator 202 disposed between a first conductor 204 and a second conductor 206. A blade 208 is movably connected to each side of the second conductor 206. The blades 208 are movable between a first, closed position where the blades are electrically and mechanically connected to the first conductor, and a second, open position electrically isolated and mechanically disconnected from the first conductor. As with the embodiment shown in FIGS. 1-3, the blades 208 are connected to the first and second conductors 204, 206 through a set of four fasteners 212, 218, 224, 228. The blades 208 include first and second optional notches (not shown) to releasably connect the blades 208 to the first conductor 204.

The first conductor 204 includes a first connection 240 (shown as a flange) for connecting the high voltage test terminal 200 to a first component in a power distribution/transmission system and the second conductor 206 includes a second connection 242 for connecting the high voltage test terminal to a second component in a power distribution/transmission system. In alternative embodiments, the first and second conductors 204, 206 can incorporate different connections, including a male projection, tapped holes, threads, clamps, bolt holes, or other suitable mechanical connections.

A first fitting or guard conductor 250 is positioned between the primary insulator 202 and the first conductor 204. The primary insulator 202 is connected to the guard conductor 250 and the guard conductor 250 is connected to the first conductor 204 with a guard insulation layer interposed between (not shown). In an exemplary embodiment, the primary insulator 202 is crimped to the guard conductor 250. In alternative embodiments, other connections can be used. The guard conductor 250 includes an optional connection ring 252 that can be used to connect test equipment to the high voltage test terminal 200.

The guard conductor 250 also includes a guard electrode 254 that extends from the guard conductor 250 to electrically connect the guard conductor 250 to one of the blades 208. In alternative embodiments, the guard electrode 254 can be connected to the first conductor 204. A non-conductive cover 256 is positioned around the guard conductor 250 to cover the interface between the guard conductor 250 and the first conductor 204. The cover 256 can act as a seal to help prevent the ingress of fluids and debris.

Figure 5:
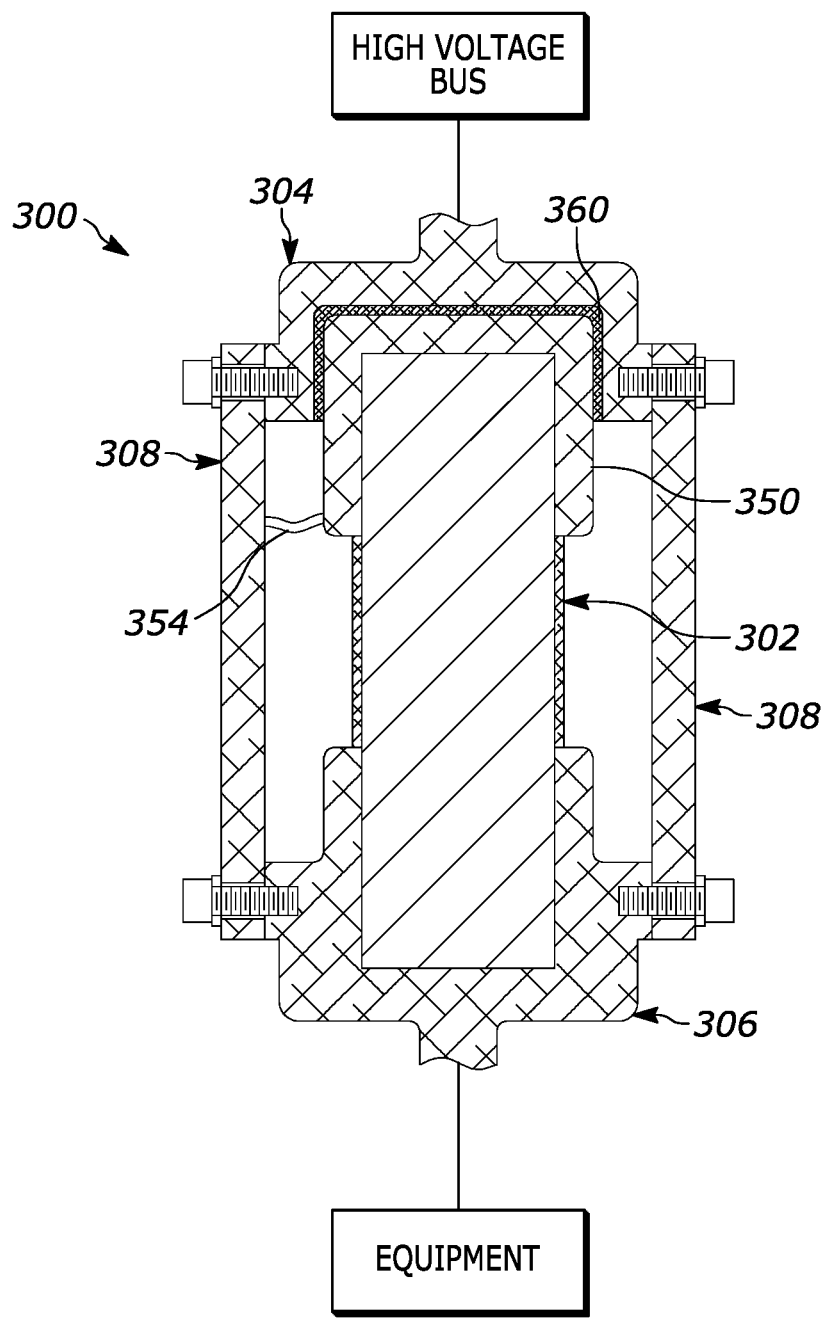
FIG. 5 is a side, sectional view of a third exemplary high voltage test terminal in a closed position.
Figure 6:
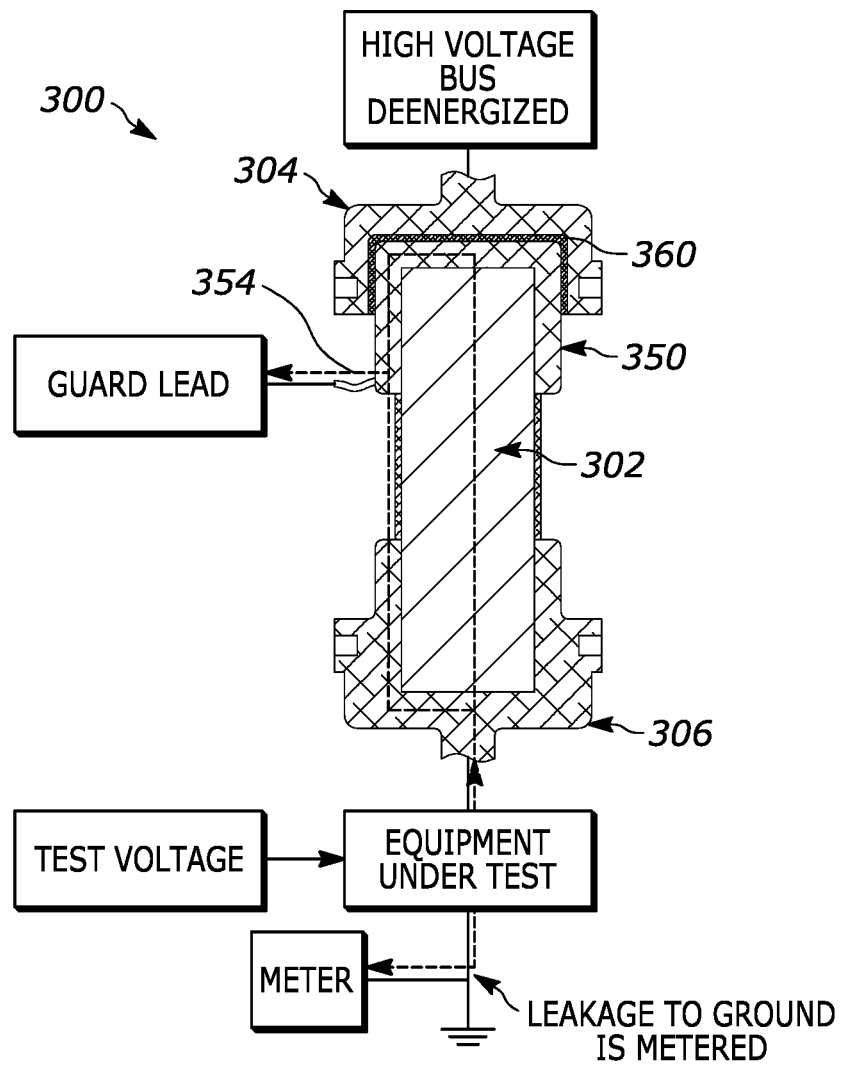
FIG. 6 is a side, sectional view of the high voltage test terminal of FIG. 5 in an open position and connected to test equipment.

FIGS. 5 and 6 show a cross-section of another embodiment of a high voltage test terminal 300. The high voltage test terminal includes a primary insulator 302 disposed between a first conductor 304 and a second conductor 306. The primary insulator 302 is connected to a guard conductor 350. A blade 308 is movably connected to each side of the second conductor 306. The blades 308 are movable between a first, closed position where the blades 308 are electrically and mechanically connected to the first conductor, and a second, open position electrically isolated and mechanically disconnected from the first conductor.

In this embodiment, the guard electrode 354 is a wire that extends from the guard conductor 350 to the blade 308. A guard insulation layer 360 is positioned between the guard conductor 350 and the first conductor 304. The guard insulation layer 360 prevents current from leaking through the primary insulator 302 body during testing. This prevents leaking current from influencing the measurement of equipment leakage going to ground and affecting the test.

Figure 7:
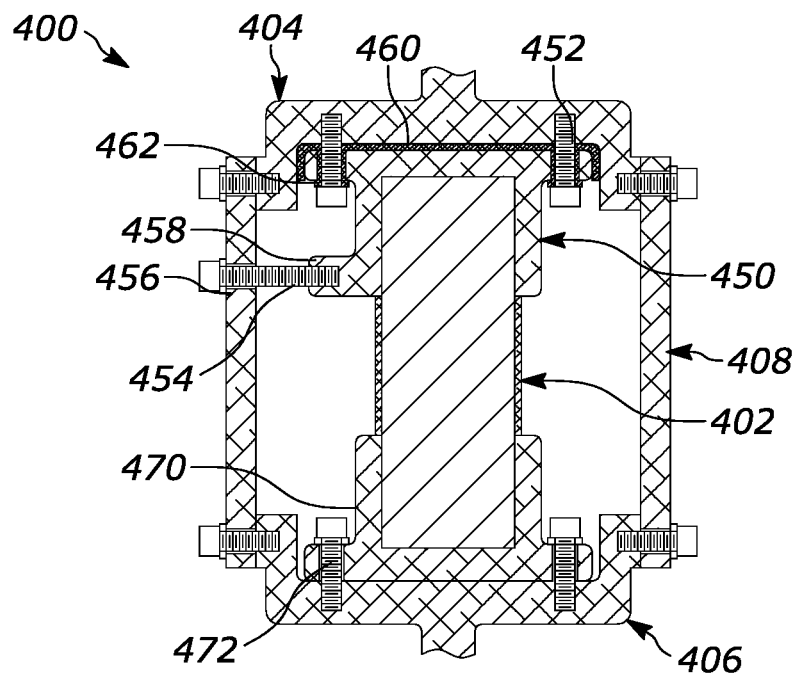
FIG. 7 is a side, sectional view of a fourth exemplary high voltage test terminal in a closed position.

FIG. 7 shows another exemplary embodiment of a high voltage test terminal 400. The high voltage test terminal includes a primary insulator 402 disposed between a first conductor 404 and a second conductor 406. A blade 408 is movably connected to each side of the second conductor 406. The blades 408 are movable between a first, closed position where the blades are electrically and mechanically connected to the first conductor 404, and a second, open position electrically isolated and mechanically disconnected from the first conductor 404.

A guard conductor 450 is positioned between the primary insulator 402 and the first conductor 404. In an exemplary embodiment, the primary insulator 402 is crimped to the guard conductor 450, and the guard conductor 450 is connected to the first conductor 404 by a set of fasteners 452. In alternative embodiments, other connections can be used. A guard insulation layer 460 is positioned between the guard conductor 450 and the first conductor 404. An insulating sleeve 462 can be provided around the fasteners 452 to prevent electrical contact between the first conductor 404 and the guard conductor 450. Alternatively, the fasteners 452 can be made of non-conductive material.

The guard conductor 450 also includes a guard electrode 454 that extends from the guard conductor 450 to electrically connect the guard conductor 450 to one of the blades 408. The guard electrode 454 includes a bolt that extends through opening 456 in the blade 408 into contact with the guard conductor 450 (shown as a threaded boss 458 that extends from a sidewall of the guard conductor 450).

A second fitting 470 is positioned between the primary insulator 402 and the second conductor 406. In an exemplary embodiment, the primary insulator 402 is crimped to the second fitting 470, and the second fitting 470 is connected to the second conductor 406 by a set of fasteners 472. In alternative embodiments, other connections can be used.

Figure 8:
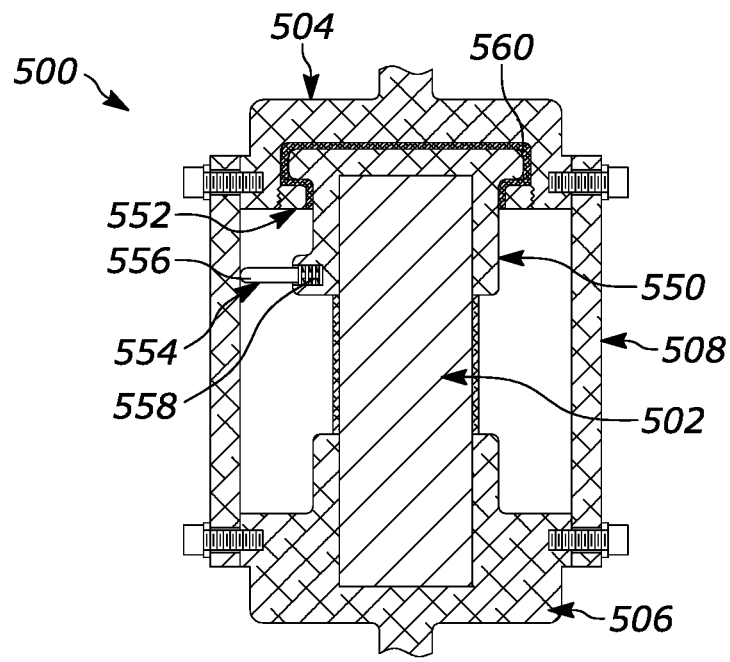
FIG. 8 is a side, sectional view of a fifth exemplary high voltage test terminal in a closed position.

FIG. 8 shows another exemplary embodiment of a high voltage test terminal 500. The high voltage test terminal 500 includes a primary insulator 502 disposed between a first conductor 504 and a second conductor 506. A blade 508 is movably connected to each side of the second conductor 506. The blades 508 are movable between a first, closed position where the blades 508 are electrically and mechanically connected to the first conductor 504, and a second, open position electrically isolated and mechanically disconnected from the first conductor 504.

A guard conductor 550 is positioned between the primary insulator 502 and the first conductor 504. In an exemplary embodiment, the primary insulator 502 is crimped to the guard conductor 550, and the guard conductor 550 is connected by a retaining ring 552 that threadably connects to the first conductor 504. In alternative embodiments, other connections can be used. A guard insulation layer 560 is positioned between the guard conductor 550 and the first conductor 504.

The guard conductor 550 also includes a guard electrode 554 that extends from the guard conductor 550 to electrically connect the guard conductor 550 to one of the blades 508. The guard electrode 554 includes a pin 556 that is moveably biased toward the blade 508 by a spring 558.

Figure 9:
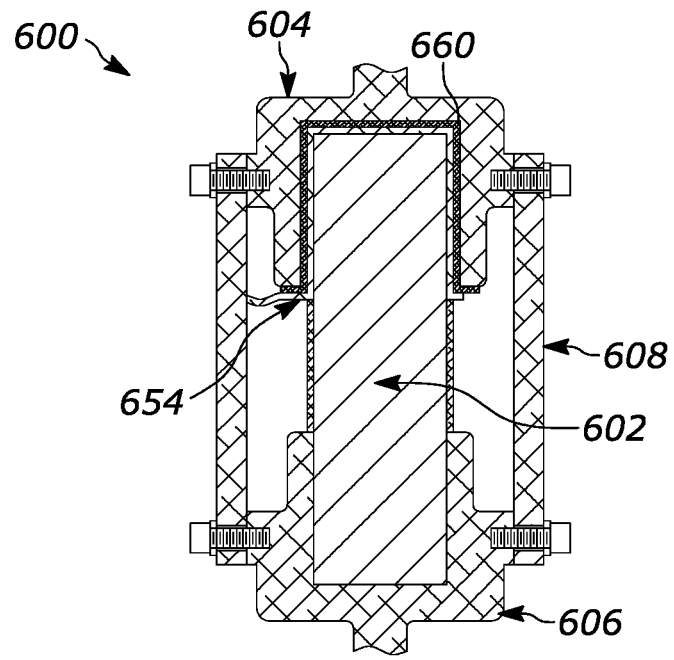
FIG. 9 is a side, sectional view of a sixth exemplary high voltage test terminal in a closed position.

FIG. 9 shows another exemplary embodiment of a high voltage test terminal 600. The high voltage test terminal 600 includes a primary insulator 602 disposed between a first conductor 604 and a second conductor 606. A blade 608 is movably connected to each side of the second conductor 606. The blades 608 are movable between a first, closed position where the blades 608 are electrically and mechanically connected to the first conductor 604, and a second, open position electrically isolated and mechanically disconnected from the first conductor 604.

The primary insulator 602 is crimped to the first conductor 604 and the second conductor 606. An insulating guard sleeve 660 is positioned between the first conductor 604 and a guard conductor 654. The guard conductor 654 is configured as a conductive sleeve and extends between the primary insulator 602 and the blade 608.

Figure 10:
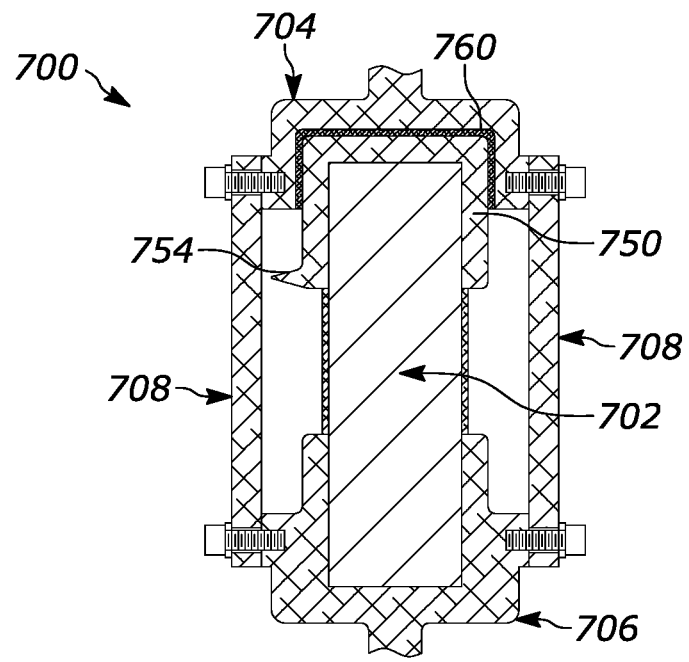
FIG. 10 is a side, sectional view of a seventh exemplary high voltage test terminal in a closed position.

FIG. 10 shows another exemplary embodiment of a high voltage test terminal 700. The high voltage test terminal 700 includes a primary insulator 702 disposed between a first conductor 704 and a second conductor 706. A blade 708 is movably connected to each side of the second conductor 706. The blades 708 are movable between a first, closed position where the blades 708 are electrically and mechanically connected to the first conductor 704, and a second, open position electrically isolated and mechanically disconnected from the first conductor 704.

A guard conductor 750 is positioned between the primary insulator 702 and the first conductor 704. In an exemplary embodiment, the primary insulator 702 is crimped to the guard conductor 750, and the guard conductor 750 is adhered to the first conductor 704. In alternative embodiments, other connections can be used. A guard insulation layer 760 is positioned between the guard conductor 750 and the first conductor 704.

The guard conductor 750 also has a guard electrode 754 that includes a projection that extends from a sidewall of the guard conductor 750 toward the blade 708, but does not make physical contact. In an exemplary embodiment, the projection is spaced from the blade 708 to form a spark gap.

Figure 11:
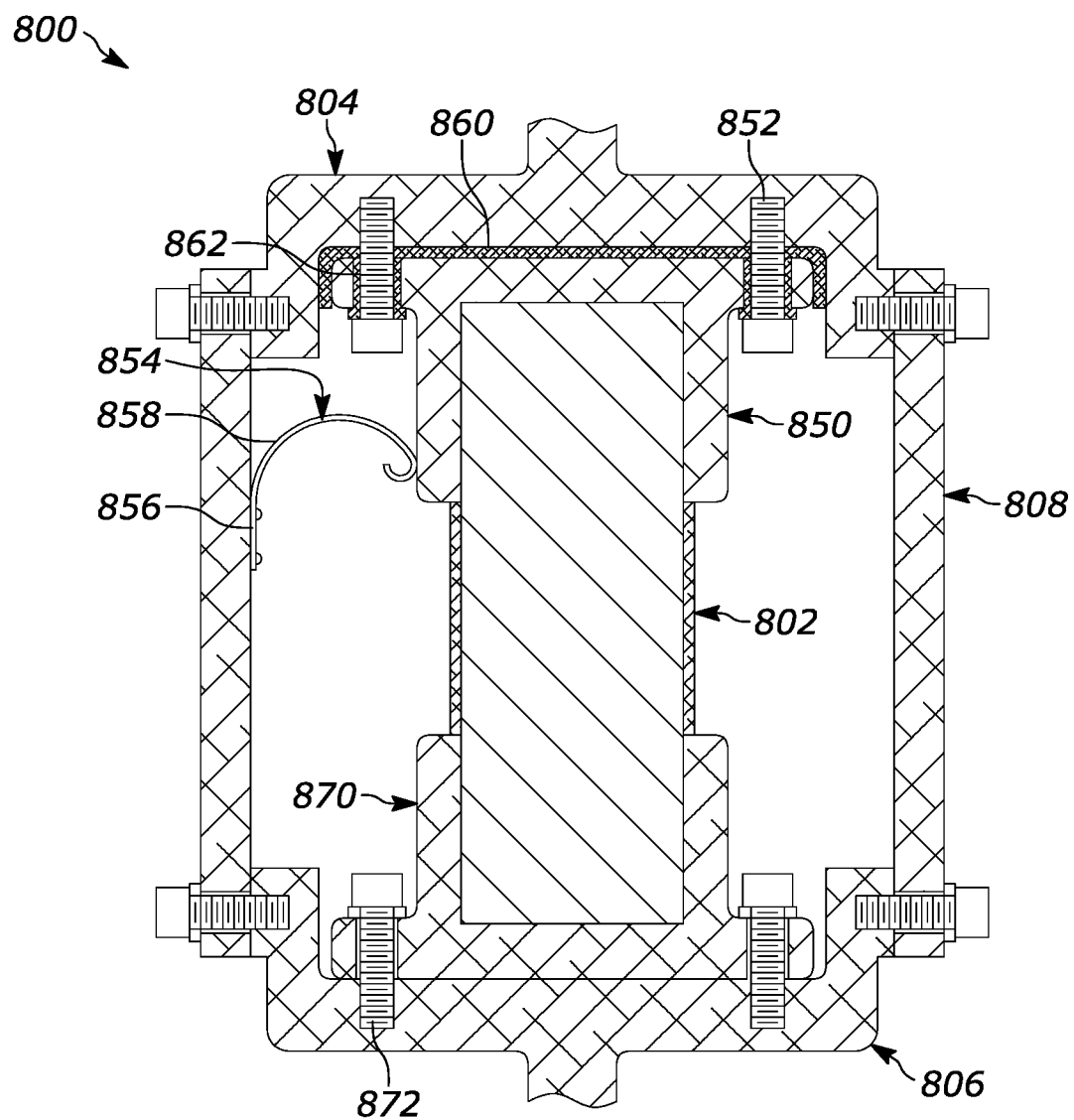
FIG. 11 is a side, sectional view of an eighth exemplary high voltage test terminal in a closed position.

FIG. 11 shows another exemplary embodiment of a high voltage test terminal 800. The high voltage test terminal includes a primary insulator 802 disposed between a first conductor 804 and a second conductor 806. A blade 808 is movably connected to each side of the second conductor 806. The blades 808 are movable between a first, closed position where the blades are electrically and mechanically connected to the first conductor 804, and a second, open position electrically isolated and mechanically disconnected from the first conductor 804.

A guard conductor 850 is positioned between the primary insulator 802 and the first conductor 804. In an exemplary embodiment, the primary insulator 802 is crimped to the guard conductor 850, and the guard conductor 850 is connected to the first conductor 804 by a set of fasteners 852. In alternative embodiments, other connections can be used. A guard insulation layer 860 is positioned between the guard conductor 850 and the first conductor 804. An insulating sleeve 862 can be provided around the fasteners 852 to prevent electrical contact between the first conductor 804 and the guard conductor 850. Alternatively, the fasteners 852 can be made of non-conductive material.

A guard electrode 854 electrically connects the guard conductor 850 to one of the blades 808. The guard electrode 854 includes a contact spring that is mounted to one of the blades 808 or the guard conductor 850. In the illustrated embodiment, the contact spring includes a base 856 mounted to the blade 808 and one or more resilient fingers 858 extending from the base 856. The resilient finger 858 can engage the guard conductor 850.

A second fitting 870 is positioned between the primary insulator 802 and the second conductor 806. In an exemplary embodiment, the primary insulator 802 is crimped to the second fitting 870, and the second fitting 870 is connected to the second conductor 806 by a set of fasteners 872. In alternative embodiments, other connections can be used.

Any combination of the components described above can be incorporated into various alternative embodiments. Additional known features can also be incorporated, including those shown in U.S. Pat. No. 8,525,526, which is incorporated herein by reference in its entirety.

The foregoing detailed description of the certain exemplary embodiments has been provided for the purpose of explaining the principles of the invention and its practical application, thereby enabling others skilled in the art to understand the invention for various embodiments and with various modifications as are suited to the particular use contemplated. This description is not necessarily intended to be exhaustive or to limit the invention to the exemplary embodiments disclosed. Any of the embodiments and/or elements disclosed herein may be combined with one another to form various additional embodiments not specifically disclosed. Accordingly, additional embodiments are possible and are intended to be encompassed within this specification and the scope of the appended claims. The specification describes specific examples to accomplish a more general goal that may be accomplished in another way.

As used in this application, the terms "front," "rear," "upper," "lower," "upwardly," "downwardly," and other orientational descriptors are intended to facilitate the description of the exemplary embodiments of the present invention, and are not intended to limit the structure of the exemplary embodiments of the present invention to any particular position or orientation. Terms of degree, such as "substantially" or "approximately" are understood by those of ordinary skill to refer to reasonable ranges outside of the given value, for example, general tolerances associated with manufacturing, assembly, and use of the described embodiments.

What is claimed:

1. A high-voltage test terminal, comprising:
   a first conductor;
   a second conductor;
   a primary insulator disposed between and coupled to the first and second conductors;
   a blade movably connected to the second conductor, the blade being electrically and mechanically connected to the first conductor in a first position and electrically isolated and mechanically disconnected from the first conductor in a second position; and
   a guard insulation layer disposed between the primary insulator and the first conductor,
   wherein a guard conductor is disposed between the primary insulator and the guard insulation layer, and
   wherein a guard electrode is disposed between the guard conductor and the blade, while coupled to either the guard conductor or the blade.

2. The high-voltage test terminal of claim 1, wherein the guard electrode is electrically connected to the blade in the first position and electrically disconnected from the blade in the second position.

3. The high-voltage test terminal of claim 1, wherein a first fastener threadably connects the blade to the first conductor in the first position, and wherein the first fastener is threadably disconnected from the first conductor and moves with said blade to the second position.

4. The high-voltage test terminal of claim 1, wherein the primary insulator is made of a shock-absorbing material.

5. The high-voltage test terminal of claim 1, wherein the guard electrode includes a pin moveably biased toward the blade.

6. The high-voltage test terminal of claim 1, wherein the guard electrode includes a bolt extending through an opening in the blade.

7. The high-voltage test terminal of claim 1, wherein the guard conductor includes a connection ring.

8. The high-voltage test terminal of claim 1, wherein the guard conductor is spaced from the blade to form a spark gap.

9. A high-voltage test terminal, comprising:
   a first conductor;
   a second conductor;
   a primary insulator disposed between and coupled to the first and second conductors;
   a blade movably connected to the second conductor, the blade being electrically and mechanically connected to the first conductor in a first position and electrically isolated and mechanically disconnected from the first conductor in a second position;
   a guard insulation layer disposed between a guard conductor and the first conductor;
   the guard conductor disposed between the primary insulator and the guard insulation layer; and
   a guard electrode extending between the guard conductor and the blade.

10. The high-voltage test terminal of claim 9, wherein the guard electrode is electrically connected to the blade in the first position and electrically disconnected from the blade in the second position.

11. The high-voltage test terminal of claim 9, wherein the blade in the first position is connected to the first conductor by a first fastener and a second fastener and connected to the second conductor by a third fastener and a fourth fastener.

12. The high-voltage test terminal of claim 9, wherein the guard electrode includes a threaded bolt.

13. The high-voltage test terminal of claim 9, wherein the guard electrode includes a pin that is moveably biased toward the blade by a spring.

14. The high-voltage test terminal of claim 9, wherein the guard electrode includes a conductive sleeve.

15. The high-voltage test terminal of claim 9, wherein the guard electrode includes projection spaced from the blade to form a spark gap.

16. The high-voltage test terminal of claim 9, wherein the guard electrode includes contact spring.

17. The high-voltage test terminal of claim 16, wherein the contact spring includes a base mounted to the blade and a resilient finger extending from the base.

18. A method of field testing electrical apparatus, comprising:
   connecting a test terminal having an insulator between a high voltage bus and the electrical apparatus to be tested, wherein the test terminal includes a blade in a closed position for normal operation and wherein the test terminal includes a guard insulation layer between the primary insulator and a first conductor;
   moving the blade of the test terminal to an open position to electrically isolate the electrical apparatus from the deenergized high voltage bus; and
   conducting both electrical and mechanical tests of the electrical apparatus after moving the blade to the open position, the insulator protecting the test terminal from shocks and vibrations resulting from the electrical and mechanical tests,
   wherein the test terminal includes a guard conductor disposed between the primary insulator and the guard insulation, and
   wherein the test terminal includes a guard electrode extending between the guard conductor and the blade.

19. The method of claim 18, wherein the guard conductor includes a connection ring.

20. The method of claim 18, wherein the guard conductor is spaced from the blade to form a spark gap.

* * * * *